(12) United States Patent
Tsai et al.

(10) Patent No.: US 6,859,129 B2
(45) Date of Patent: Feb. 22, 2005

(54) THREE-DIMENSIONAL INTEGRATED ADJUSTABLE INDUCTOR, ITS MODULE AND FABRICATION METHOD OF THE SAME

(75) Inventors: Shu-Hui Tsai, Hsinchu (TW); Shang-Yu Liang, Hsinchu (TW); Chun-Hsien Lee, Hsinchu (TW)

(73) Assignee: Asia Pacific Microsystems, Hsinchu (TW)

(*) Notice: Subject to any disclaimer, the term of this patent is extended or adjusted under 35 U.S.C. 154(b) by 149 days.

(21) Appl. No.: 10/223,362

(22) Filed: Aug. 20, 2002

(65) Prior Publication Data

US 2004/0036569 A1 Feb. 26, 2004

(51) Int. Cl.⁷ .................................................. H01F 5/00
(52) U.S. Cl. ....................................... 336/200; 29/602.1
(58) Field of Search .................. 336/83, 200, 206–208, 336/232; 29/602.1; 761/760–766

(56) References Cited

U.S. PATENT DOCUMENTS

| | | | |
|---|---|---|---|
| 4,222,090 A | * | 9/1980 | Jaffe ........................... 361/715 |
| 5,788,854 A | * | 8/1998 | Desaigoudar et al. ......... 216/13 |
| 6,462,950 B1 | * | 10/2002 | Pohjonen .................... 361/704 |

* cited by examiner

*Primary Examiner*—Tuyen T. Nguyen
(74) *Attorney, Agent, or Firm*—Troxell Law Office PLLC

(57) ABSTRACT

A three dimensional adjustable high frequency inductor, its module and fabrication method of the same. The high frequency module includes micro high frequency inductors, filters, resistors, capacitors and associated with active components or power components to form a hybrid circuit, then it is packaged by using the technology of flip chip or wafer level packaging, so as to upgrade properties of high frequency modules and reduce the packaging and instrumentation costs by minimizing the modular size.

15 Claims, 14 Drawing Sheets

THREE-DIMENSIONAL INTEGRATED ADJUSTABLE INDUCTOR, ITS MODULE AND FABRICATION METHOD OF THE SAME

BACKGROUND OF THE INVENTION

1. Field of the Invention

The present invention relates to a three-dimensional high frequency inductor, its module and fabrication method of the same; the passive components, such as miniaturized high frequency inductors, filters, resistors, capacitors are associated with active components or power components to form an integrated circuit, then it is packaged by using the technology of flip chip or wafer level packaging, so as to upgrade the properties of high frequency modules and reduce the packaging and measurement costs by minimizing the modular size.

2. Description of the Prior Art

Rapid growth in technological development of mobile communication has stimulated need of high frequency radio devices a great deal. The prosperity of radio communication products depends a lot on the size of their component parts and durability of batteries used. Accordingly, the component manufacturers have been doing their efforts in developing components which are more effective yet smaller in size and cheaper in cost than ever. The ultimate goal of minimizing these components is to combine them with an integrated circuit (IC) to form a system-on-chip (SOC). However, there is a big problem in forming SOCs by combining varieties of function provided by different suppliers, since a considerably long time is required for transferring techniques pertaining to particular intellectual property and combining products and fabricating processes which are individually developed by different manufacturers. To cope with the above depicted situation, it is absolutely necessary to establish a systematic technology of combining varieties of wafers, dies provided by different manufacturers and instrumentation processes of dies in advance so as to improve yield rate and to save packaging cost. At the same time, through establishment of perfect customization, intellectual property can be surely protected. In order to minimize product size, power consumption and electro-magnetic interference, to decrease complexity of fabrication process and to improve portability of the products in a relatively low cost way, the combination of active components made of wafers with different fabrication processes and materials with IC circuit modules of high density passive components to form high density IC SOC by packaging process is preferably feasible.

At present, there are two series of high frequency module products composed of combined passive components having competitive force in fabrication technique and product cost. The first one is a thin film high frequency module compatible with IC manufacturing process, the second one is a low temperature co-fired ceramic (LTCC) module with a very high durability for high frequency power as its greatest advantage, but there are a lot of outstanding problems still have to be resolved, for examples, insufficient line width, difficulty in measurement, difficulty in obtaining the ceramic powder, and occurrence of ceramic shrinkage during fabrication process etc. Therefore, severe deviation between fabrication process and simulation result is occurred and which is difficult to rectify. As for fabrication cost, it appears no significant difference between two series of products mentioned above, but the thin film combined high frequency module has a tangible superiority of its smaller product size, and is able to combine active circuit components to realize systematic simulation so as to be benefited by saving, research cost and shortening research time.

A high frequency module requires many passive components in it, and occupies a considerably large space. These passive components are composed of resistors, capacitors, inductors, conductors, coupling wire or transducers. In the passive components, resistors and capacitors which can be easily figured out with simple formula with fewer problems for performance. While the inductor, which being a magnetic element, is relatively tedious procedure. The most commonly used inductor at present is one formed in a planar spiral configuration which can be easily manufactured with advantages of low noise and very small power consumption, but on the contrary, it is disadvantageous because of a bulky size and an unstable inductance value influenced by fabrication process and a low quality factor. Especially, in a planar spiral inductor used in IC, mutual induction between its magnetic line of force with the IC substrate further exacerbates degrading the Q (quality factor) value of device and resulting in a low efficiency of the device.

For achieving the object of improving the property of the inductors in a high frequency module, it is a commonly adopted method to lower the loss of the substrate and minimize the resistance of the metal layer. Means for lowering the substrate loss includes using a high impedance substrate, etching the part of the substrate beneath the inductor, interlarding a thin isolation layer (SGS or PGS), or a porous silicon oxide layer (OPS) between the inductor and the substrate. While the means for minimizing the resistance of the metal layer includes using a thick metal layer, connecting a plurality of metal layers in parallel, or adopting electroplating process etc. Besides, an elaborate circuital layout is another feasible solution.

In the past decade, benefited by rapid growth of the technology for fabricating micro-electromechanical elements, a three-dimensional spiral inductor becomes compatible in an IC so as to replace a conventional planar spiral inductor. As for representative fabrication methods for this new type of inductor are: applying three-dimensional laser molding or surface micro electro-mechanical technology so as to keep the area required for an inductor as small as possible, and at the same time allowing the effect of substrate parasitic capacitance.

FIG. 1a through FIG. 1f are schematic views of structure for a planar spiral inductor and fabrication process of same in U.S. Pat. No. 5,844,299 pertaining to American National Semiconductor Co. The conventional silicon substrate of a suspended inductor is removed by etching, but herein the inductor is suspended on the silicon substrate by means of micro-electro-mechanical technique. As shown in FIGS. 1a and 1b, using photo-lithographic method, a predetermined etching region 12 is defined on a substrate 10 by photo resistance 11, next, etching is carried out by an etchant so as to form a cavity 13; then, as shown in FIGS. 1c and 1d, forming a sacrificial layer 14 on the cavity 13 by coating and polishing the surface thereof smooth (as shown in FIG. 1e); after that, as shown in FIG. 1f, forming a supporting layer 15 and an inductance metallic pattern 1b on the smoothed sacrificial layer 14; finally, removing the sacrificial layer 14 so as to complete a suspended inductor.

FIGS. 2a and 2b are schematic views of structure for a three-dimensional solenoid inductor in U.S. Pat. No. 6,008, 102 pertaining to Motorola Co. As shown in these two drawings, a buffer layer 26 and a seed layer 25 are grown on a substrate 20, then the three-dimensional solenoid inductor 21 is constructed by means of a first photo-resistive layer 22, a second photo-resistive layer 23, and a third photo-resistive layer 24 wherein the metal for forming the inductor 21 is essentially made by electroplating, the seed layer 25 is necessary to be included between the metal layers for stacking up the inductor 21. This type of inductor are quite different from a planar spiral inductor in that its inductance varies in proportional to the number of turns. This is a very important and valuable feature in designing a three-dimensional solenoid inductor. On the contrary, the inductance of a planar spiral inductor can not maintain a linear relationship with its number of turns but is influenced by the parasitic and coupling capacitances between the silicon substrate and the metal layer. Accordingly, it is difficult to estimate an accurate value of inductance. Furthermore, the spacing between spiral turn also affect the quality factor of the inductor. If the spacing is too small, the inductance will decrease notwithstanding the quality factor is improved by increasing density of magnetic fluxes there between. There are several advantages concerning the solenoid inductor: a good inductor on the silicone substrate, an inductance in linear relationship with number of turns, the shorten distance between adjacent coils thereby minimizing the size of the inductor, and the provision of thicker metal layer so as to improve ability for withstanding high current. But instead of its high quality, stability of the three dimensional structure is apt to be influenced by bonding force between layers provided by the seed layer 25 for the reason that the inductor is electroplated. Especially, the final fabrication processes, i.e. packaging, and application in mobile communication, the unpreventable shock or vibration will definitely affect its property. Besides, the three-dimension solenoid inductor is able to shorten the distance between coils to decrease its size, but it is difficult to avoid resonance arising from the inductance and the capacitance distributing between the inductor windings. As a result, inductance of the inductor varies as the frequency is changed, and from worse to worst, the inductor's behavior deviates far apart from an inductor and approaches a capacitor. Accordingly, minimizing above mentioned distributing capacitance as low as possible is important for widening applicable frequency range for this high frequency module.

SUMMARY OF THE INVENTION

It is an object of the present invention to resolve aforesaid disadvantages of conventional techniques.

It is another object of the present invention to provide a fabrication method for combining a high quality inductor in a high frequency module thereby upgrading the quality of the same.

It is further object of the present invention to provide an inductor whose inductance varies linearly with its number of turns so as to upgrade the quality of the high frequency module.

It is one more object of the present invention to combine active and passive circuits formed of different wafer fabrication processes to realize systematic simulation so as to decrease the research cost and shorten the research time required.

For achieving these and other objects, the fabrication method of high frequency module according to the present invention provides a three-dimensional S-type high frequency inductor with an improved Q value for obtaining a high frequency module with good properties.

The method of the present invention further provides an arrayed coplanar jointed pads, it provides the selectivity and facilitating trimming of the high frequency inductor.

The method of the present invention further provides packaging technology of flip-chip and wafer level chip scale package (WLCSP) to combine active and passive circuits formed of different processes for realizing the systematic simulation so as to reduce research cost and shorten research time required for communication high frequency module.

The method of the present invention provides a combined CMOS circuit, a chip for treating base band signal, chips for system control, and a memory chip all combined together to form an unit package and attains the aim of isolation and protection between high frequency and low frequency regions.

A more complete understanding of these and other features and advantages of the present invention will become apparent from a careful consideration of the following detailed description of certain embodiments illustrated in the accompanying drawings.

BRIEF DESCRIPTION OF THE DRAWINGS

FIG. 3b is a cross sectional view of each layer of the toroidal-meander type high frequency inductor shown in FIG. 3a.

DETAILED DESCRIPTION OF THE PREFERRED EMBODIMENT

FIG. 1a to FIG. 2b are schematic views of two types of conventional high frequency inductors which have been fully described in foregoing context and will not be repeated.

Figure 1A:
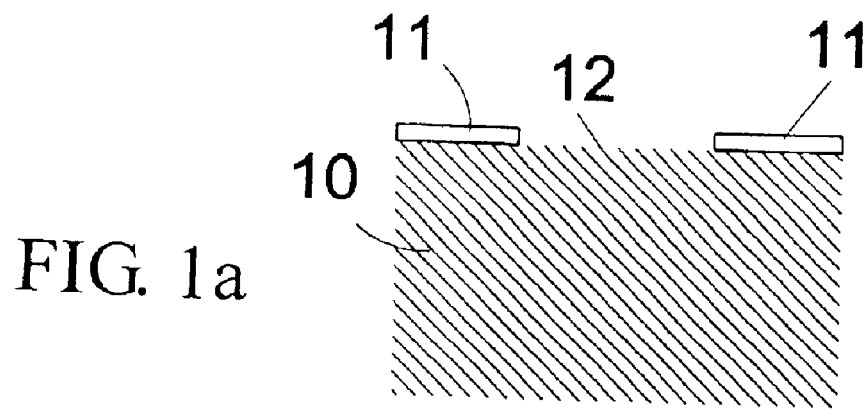
FIGS. 1a~1f are schematic views of a conventional planar suspended high frequency inductor.
Figure 1B:
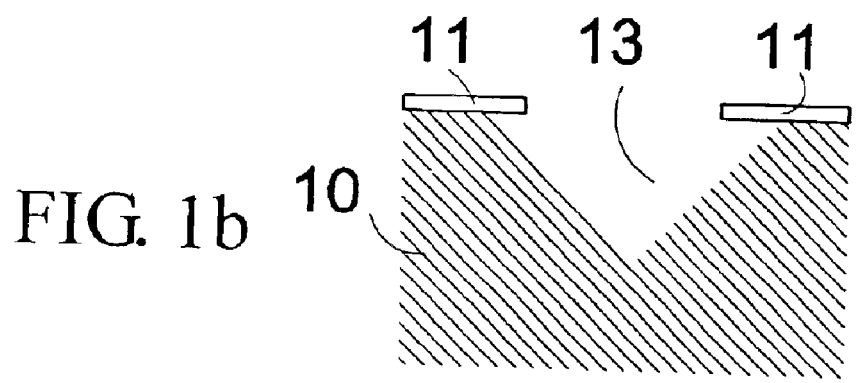
Figure 1C:
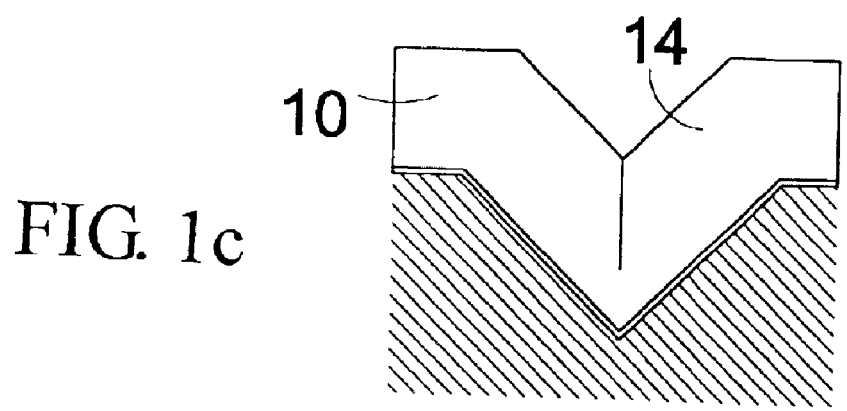
Figure 1D:
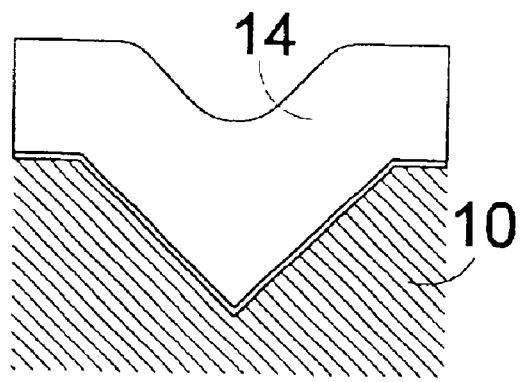
Figure 1E:
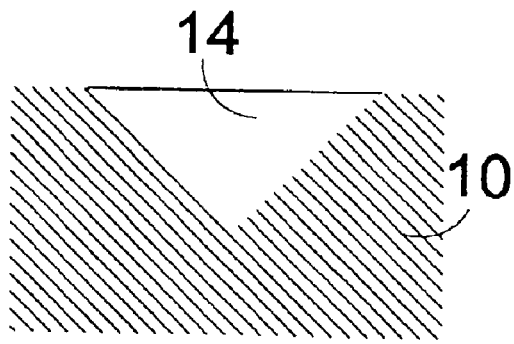
Figure 1F:
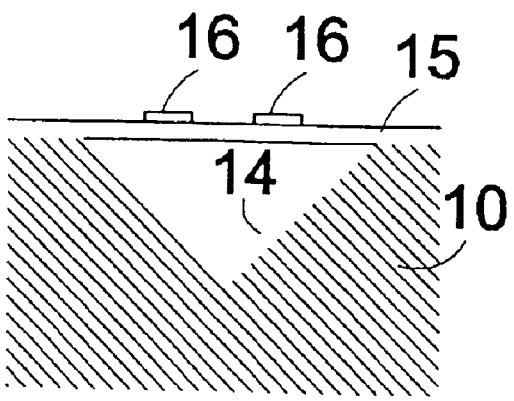
Figure 2A:
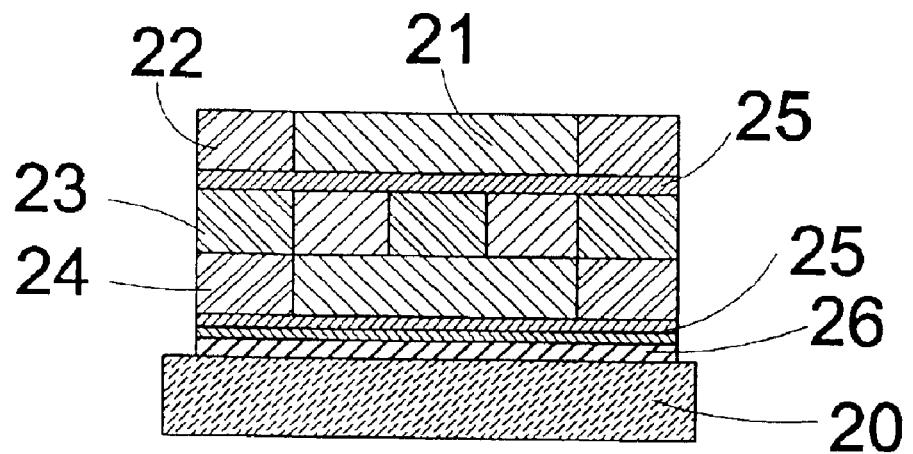
FIG. 2a and FIG. 2b are schematic views of a conventional three-dimensional solenoid high frequency inductor.
Figure 2B:
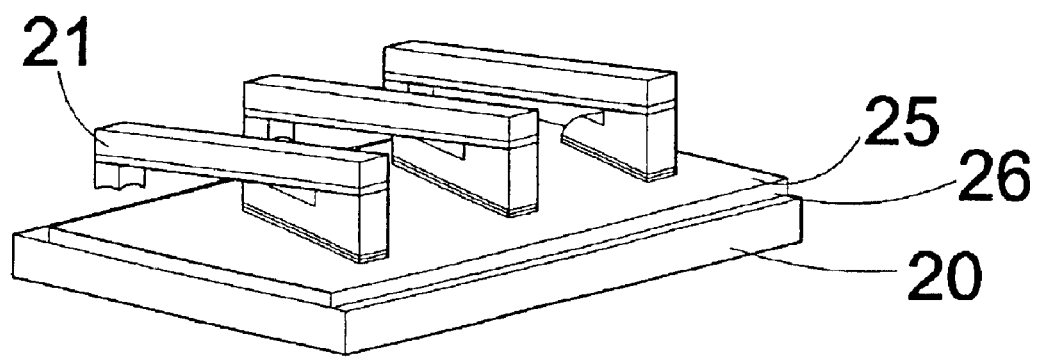
Figure 3A:
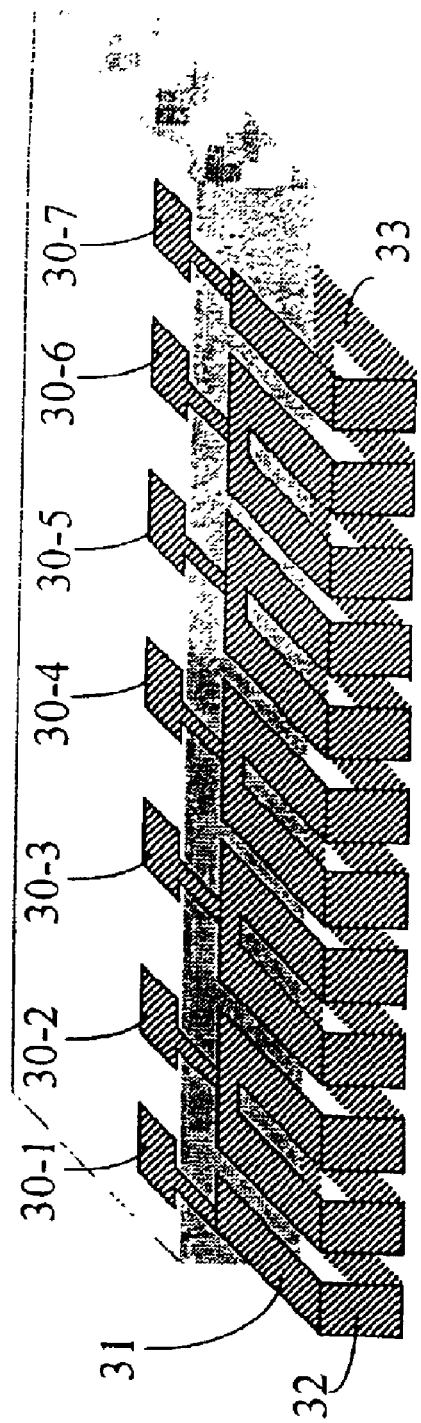
FIG. 3a is a schematic view of a double layered adjustable toroidal-meander type high frequency inductor which is a combination of planar S type and spiral type high frequency inductor of the first embodiment of the present invention.
Figure 3B:
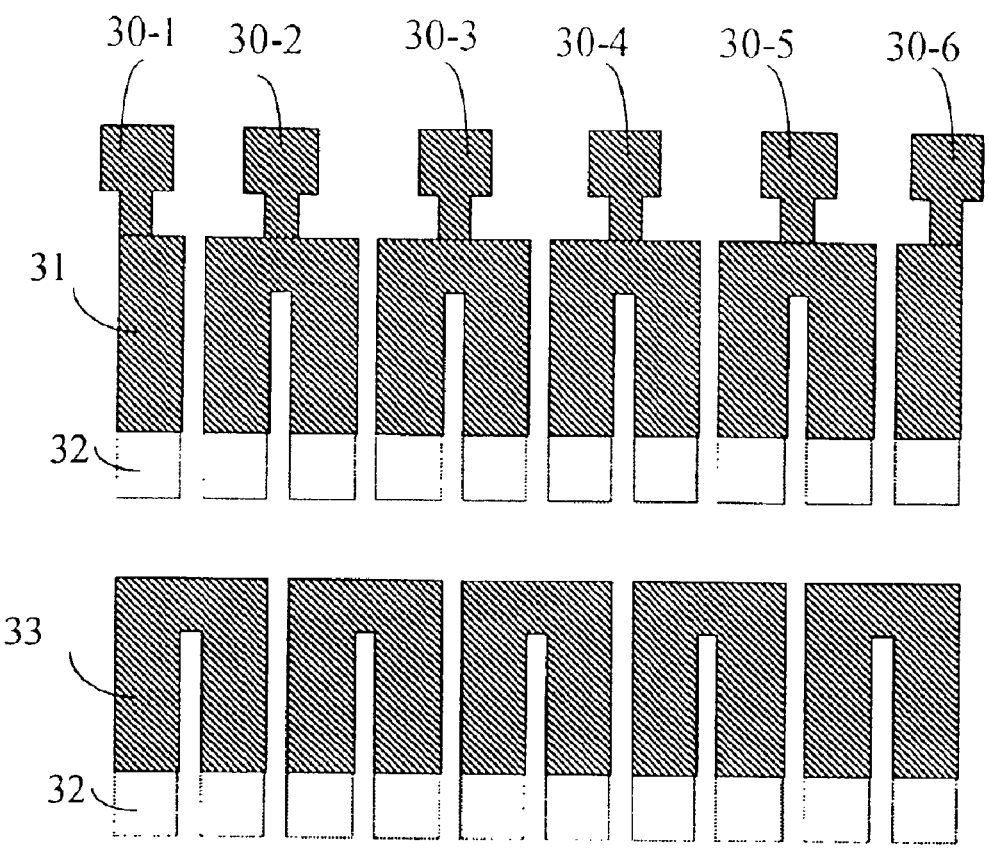

FIG. 3a shows a schematic view of a double layered adjustable toroidal-meander type high frequency inductor which is a combined planar S-type and toroidal-meander high frequency inductor in a first embodiment. As shown in FIG. 3a, 30-1 to 30-7 are jointed pads for trimming inductance value which can be jointed in any number according to the inductance required, it should be noted in this case the value of inductance is in a linear relationship with number of turns of the inductor. Meanwhile, a plurality of jointed pads 30-1 to 30-7 fixed on a substrate is not only used to trim value of inductance but also for sustaining entire structure of three dimensional inductor stably. The pads 30-1 to 30-7 can either be arrayed in single side, or staggeringly disposed along two sides as long as structural stability is concerned. Besides, the entire three dimensional structure of inductor is recessively mounted between two adjacent walls so as to avoid damage from inadvertent impact. The cross sectional views per layer of the toroidal-meander type high frequency inductor are shown in FIG. 3b, wherein the upper drawing includes a metallic pattern 31 of an upper layer inductor and a plurality of jointed pads 30-1 to 30-7, while the lower drawing includes a metallic pattern 33 of an lower layer inductor. The upper and the lower metallic patterns 31 and 33 are interconnected with each other by an intermediate metallic part 32.

Figure 4A:
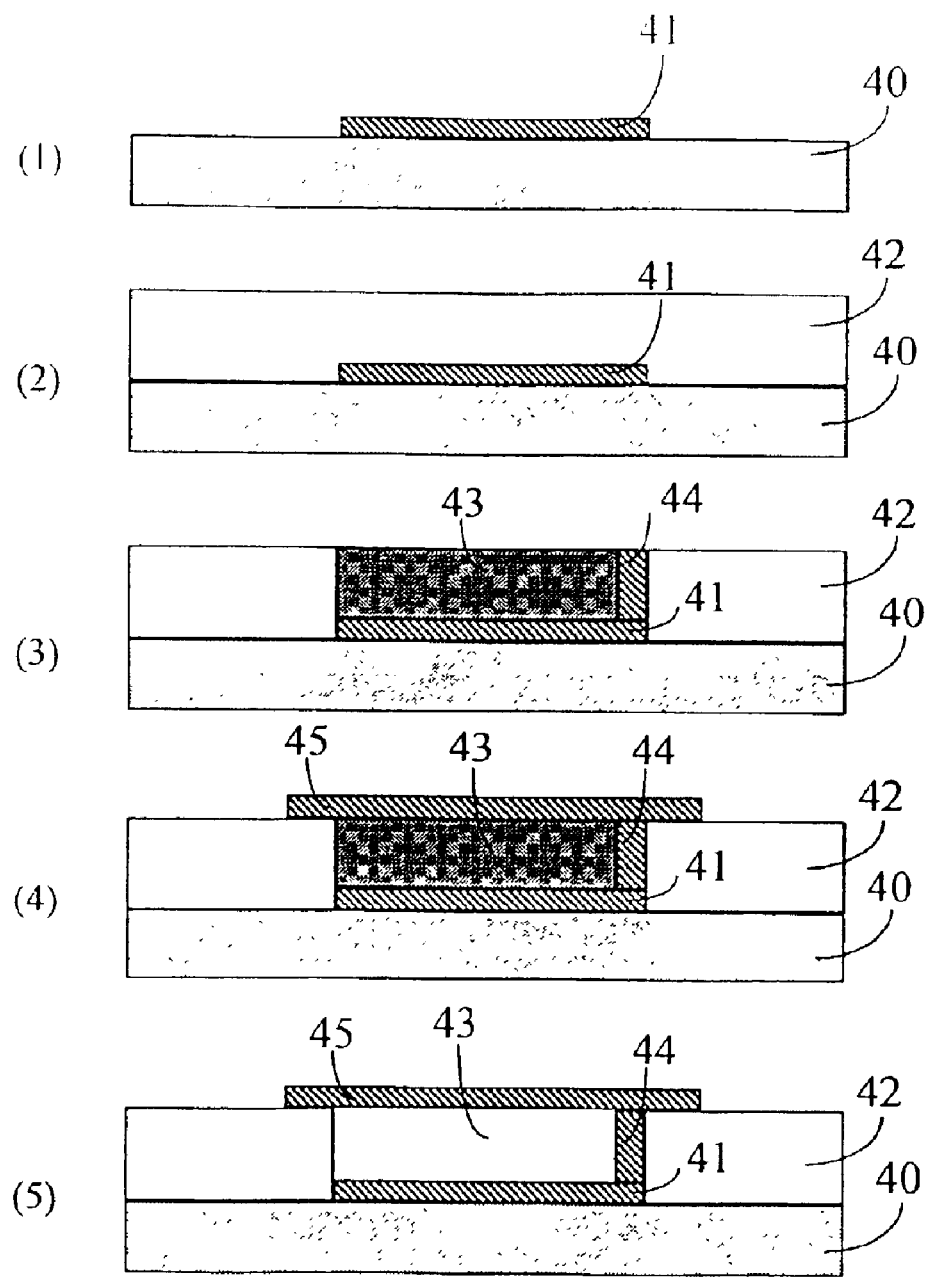
FIGS. 4a~4c are illustrative views showing fabrication process of the adjustable toroidal-meander type high frequency inductor in a first embodiment of the present invention.
Figure 4B:
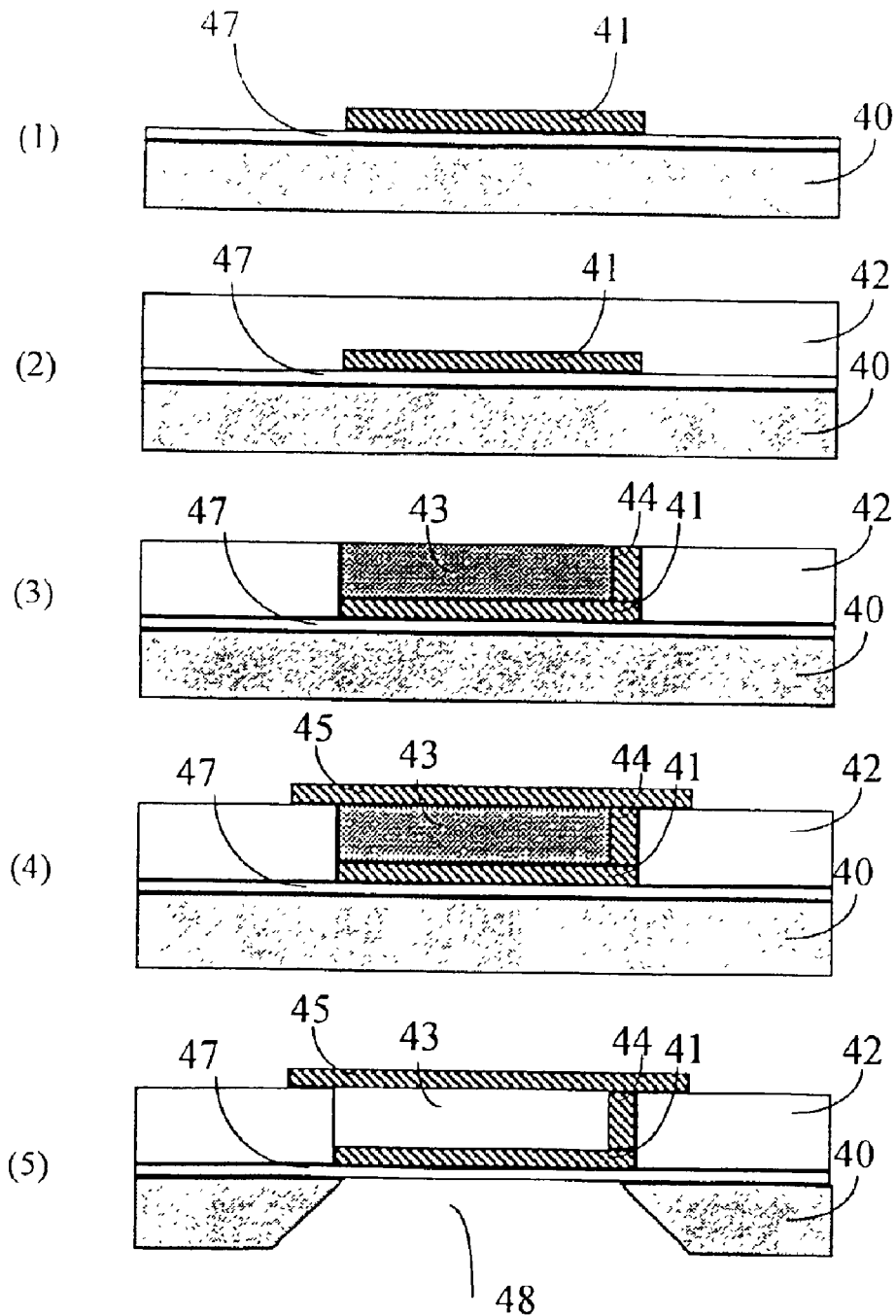
Figure 4C:
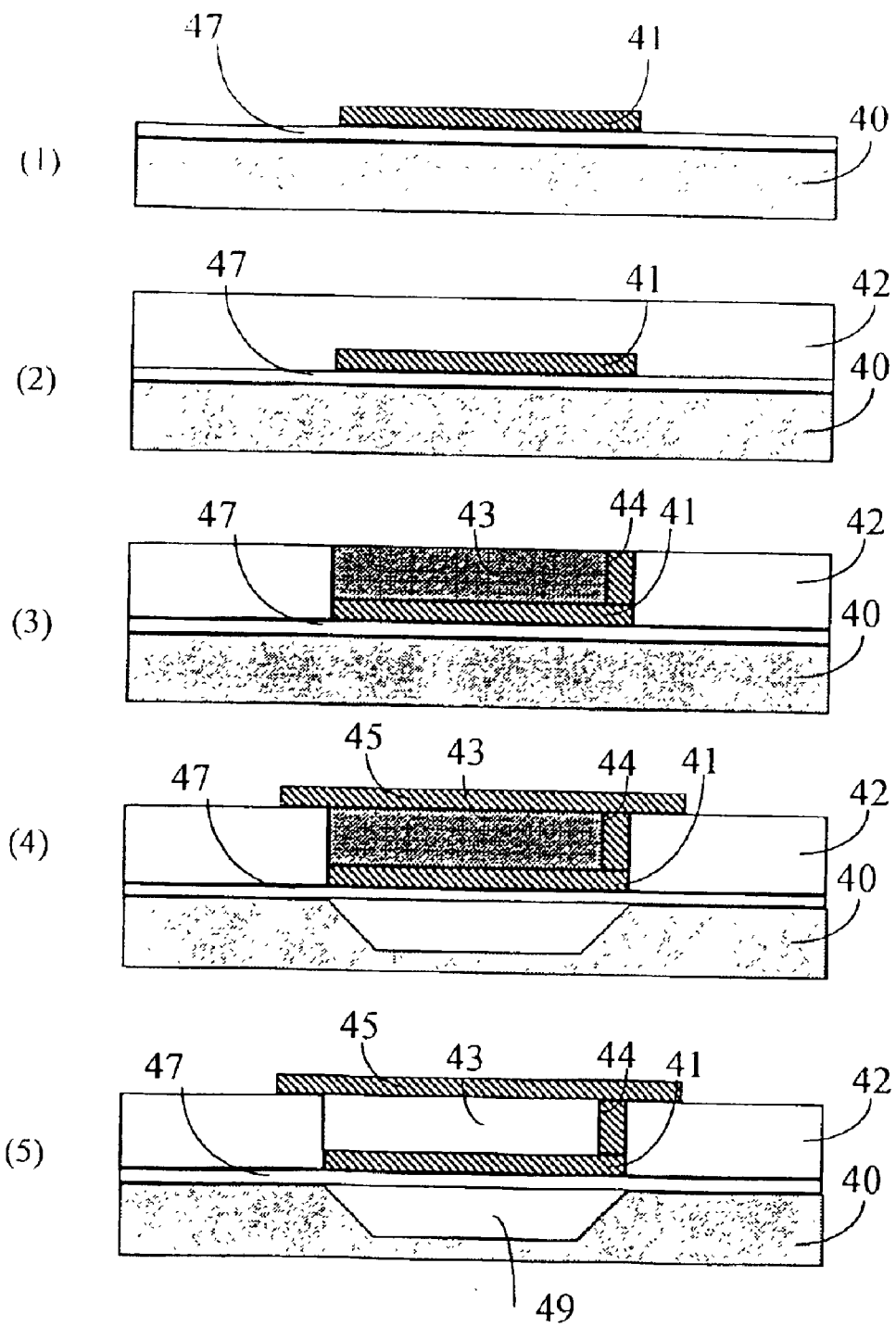

FIG. 4a through FIG. 4c illustrate fabrication process of the adjustable toroidal-meander type high frequency inductor of the first embodiment of the present invention, wherein FIG. 4a illustrates fabrication process using an insulated aluminum oxide or a glass substrate, and FIG. 4b and FIG. 4c illustrate respectively the fabrication processes wherein a backside etching and a front side etching are applied to remove the substrate formed of semiconductor silicone.

As shown in FIG. 4a, a first metallic pattern 41 is formed on a substrate 40 [as shown in FIG. 4a(1)]. Next, forming a first dielectric layer 42 by coating on the first metallic pattern 41 [as shown in FIG. 4a(2)]. Then defining the first dielectric layer 42 by means of masked photo-lithographic technique to form an empty hole. Then filling the empty hole to define a second dielectric layer 43, and forming a second metallic layer 44 by deposition to interconnect the upper and the lower metallic patterns [as shown in FIG. 4a(3)]. Then forming a third metallic pattern 45 on the entire structure so as to construct an upper metallic pattern of the high frequency inductor for electrically connecting with other circuitry components. This third metallic pattern 45 can be formed into a metallic layer with metal deposition process, and then defining the third metallic pattern 45 by etching [as shown in FIG. 4a(4)], or finishing it by electroplating. Finally removing the second dielectric layer 43 by etching using, an etchant thereby completing the fabrication process for this structure [as shown in FIG. 4a(5)].

In case the substrate effect is to be eliminated or to the semiconductor substrate is to be used, the substrate under the inductor can be removed by etching after the inductor is fabricated on the substrate. There are two ways may be performed in etching the substrates, FIG. 4b shows a way that the substrate under the inductor structure is removed from the backside of the substrate. FIG. 4c shows the other way that the substrate under the inductor structure is removed from the front side of the substrate.

A double layered adjustable toroidal-meander type high frequency inductor with the method of removing from the backside is shown in FIG. 4b, firstly, a sustaining layer 47 is formed on the substrate 40 and then a first metallic pattern 41 is formed [as shown in FIG. 4b(1)]. Afterwards, forming the first dielectric layer 42 on the first metallic pattern 41 by coating so as to form an empty hole [as shown in FIG. 4b(2)]. Then defining the second dielectric layer 43 by filling up the empty hole. Then forming the second metallic layer 44 by deposition [as shown in FIG. 4b(3)] to interconnect the upper and the lower metallic patterns. Afterwards, forming the third metallic pattern 45 on the entire structure so as to construct the upper metallic pattern of the high frequency inductor for electrically connecting with other circuital components [as shown in FIG. 4b(4)]. This third metallic pattern 45 can be defined by etching a metallic layer formed with metal deposition, or can be formed by electroplating. Finally, the second dielectric layer 43 is removed by wet etching so as to complete the fabrication processes of the inductor [as shown in FIG. 4b(5)]. Afterward, a cavity 48 is formed using the backside etching to remove substrate.

The double layered adjustable toroidal-meander type high frequency inductor can eliminate substrate effect by etching the substrate from the front side. Referring to FIG. 4c, it comprises the steps of forming a sustaining layer 47 on the substrate 40, and using masked photolithography to form an etching window for etching the substrate to be followed; and forming a pattern for the sustaining layer 47; and then forming the first metallic pattern 41 [as shown in FIG. 4c(1)]; then forming the first dielectric layer 42 on the first metallic pattern 41 by coating [as shown in FIG. 4c(2)]; afterwards filling the empty hole with the second dielectric layer 43 after defining the empty hole, and forming the second metallic layer 44 by deposition to interconnect the upper and the lower metallic patterns [as shown in FIG. 4c(3)]; then forming the third metallic pattern 45 on the entire structure so as to construct an upper metallic pattern for the high frequency inductor for electrically connecting with other circuital components [as shown in FIG. 4c(4)]; forming a metallic layer with this third metallic pattern 45 by etching, or by common electroplating; and finally, removing the second dielectric layer 43 with an etchant thereby completing fabrication of the inductor component. After that, removing the substrate by etching, the etching process may begin from an etching window exposed on the front surface of the substrate after removing the second dielectric layer 43 using either an isotropic or an anisotropic etching. After forming a blank cavity 49 after removal of the substrate, a double layered adjustable toroidal-meander type high frequency inductor is suspended on the substrate [as shown in FIG. 4c(5)].

Figure 5A:
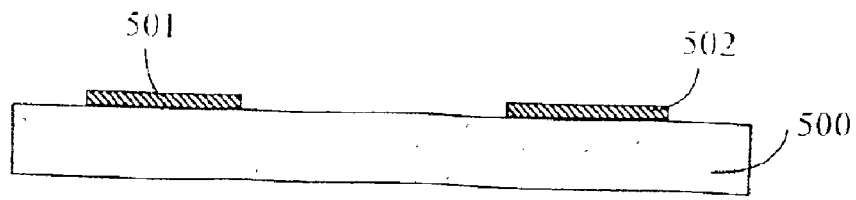
FIGS. 5a~5o are the cross sectional views of combined circuit of the toroidal-meander type high frequency inductor and the passive components of a second embodiment of the present invention.
Figure 5B:
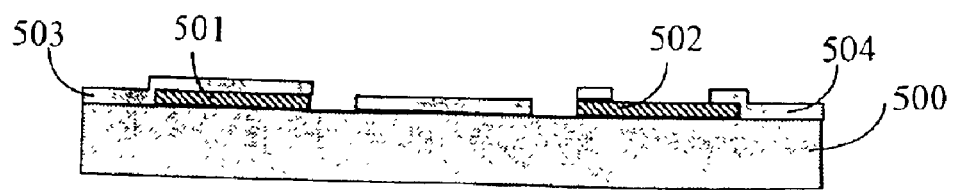
Figure 5C:
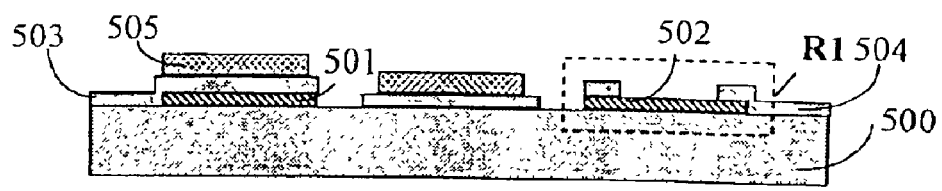
Figure 5D:
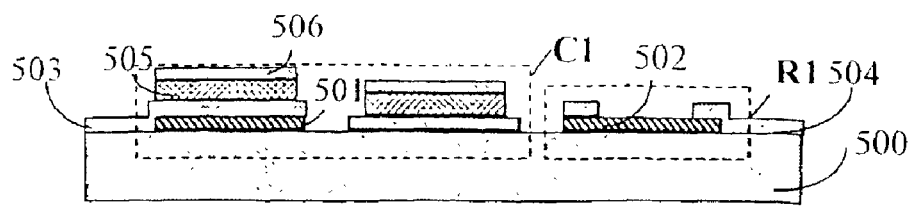
Figure 5E:
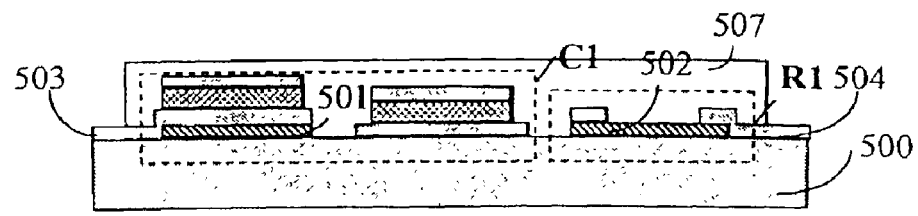
Figure 5F:
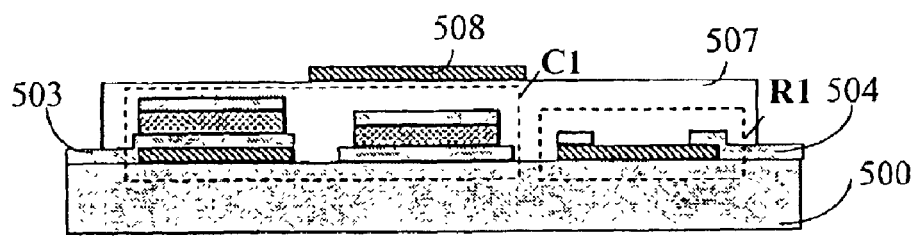
Figure 5G:
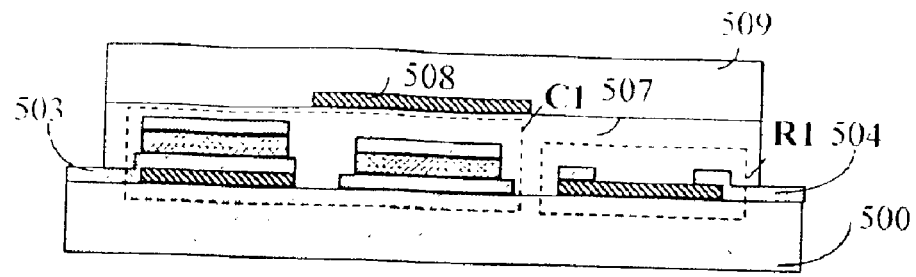
Figure 5H:
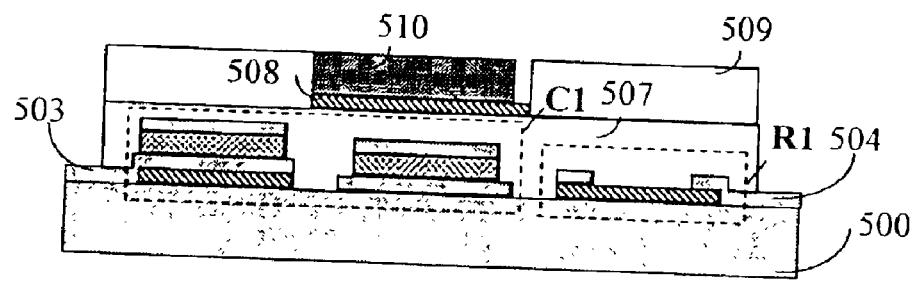
Figure 5I:
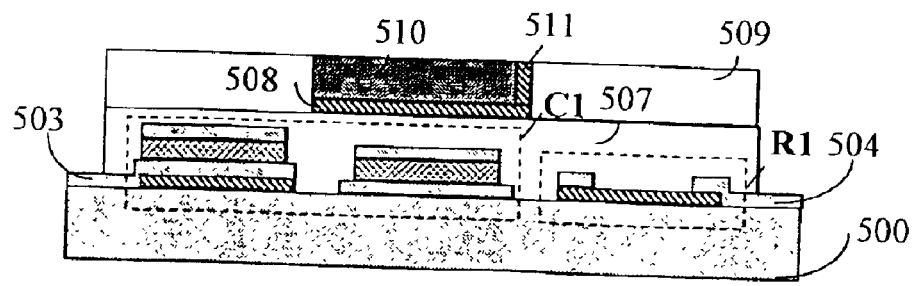
Figure 5J:
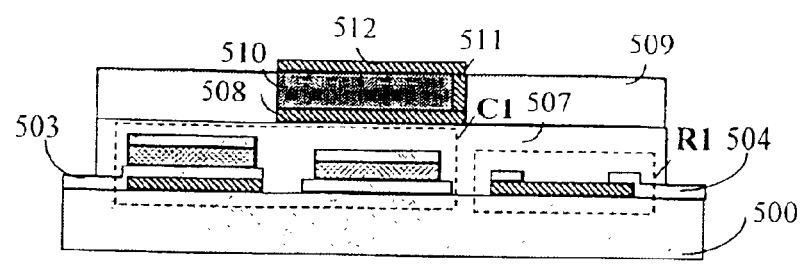
Figure 5K:
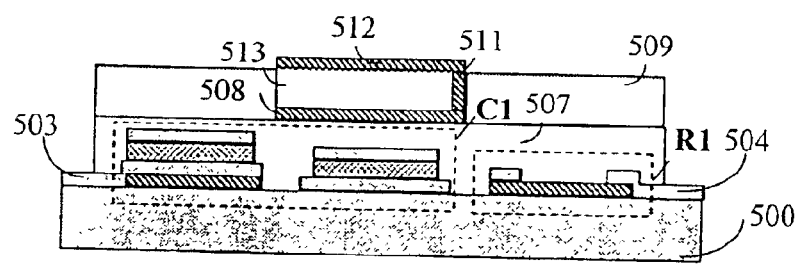
Figure 5L:
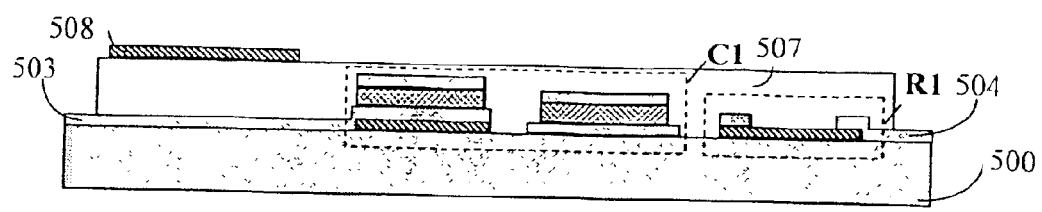
Figure 5M:
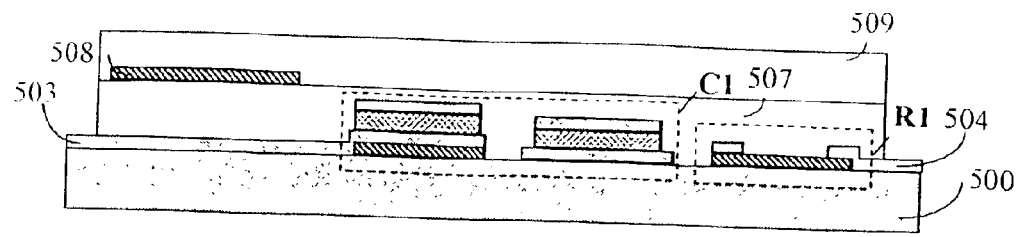
Figure 5N:
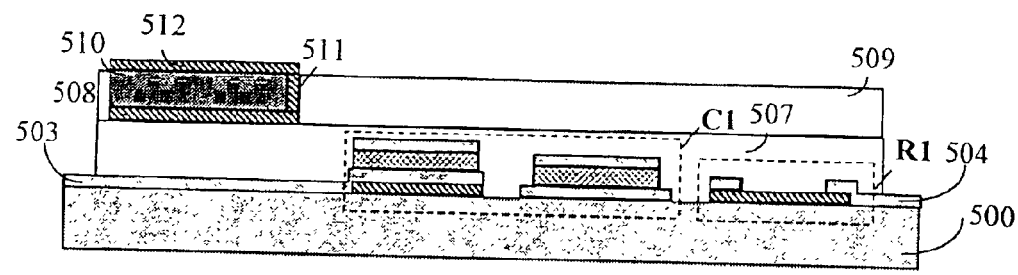
Figure 5O:
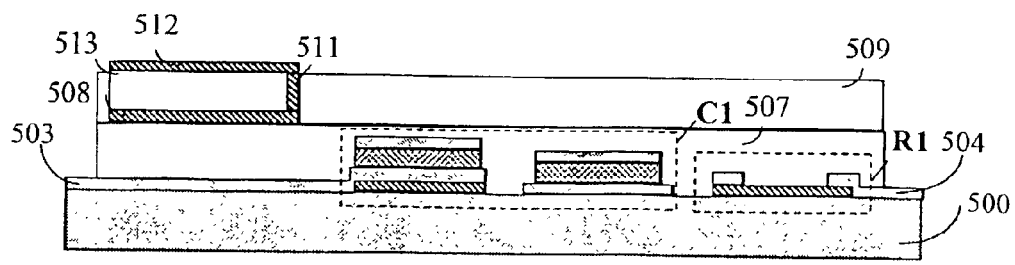

FIGS. 5a~5o are cross sectional views of combined circuit of the toroidal-meander type high frequency inductor and the passive components of the second embodiment of present invention. As shown in FIGS. 5a~5e, at first, resistor layers 501 and 502 are formed and defined on a substrate 500 by deposition (as shown in FIG. 5a). Two first metallic patterns 503, 504 are defined by etching or lift-off method after deposition (as shown in FIG. 5b). These two first metallic patterns 503, 504 simultaneously serve as two electrode terminals of a resistor R1 and the lower electrode of a capacitor C1. Then successively depositing and defining a first dielectric layer 505 (as shown in FIG. 5c), and a second metallic pattern 506, the first dielectric layer 505 interlarded between the first and the second metallic patterns 503 and 506 forms the capacitor C1 there between (as shown in FIG. 5d). Then a second dielectric layer 507 is formed on the resistor R1 and the capacitor C1 by coating an insulation layer uniformly with a sufficient thickness. Then as shown in FIGS. 5f~5k, a three-dimensional high frequency inductor over the passive components with above described structure is constructed so as to obtain an effective and space saving, minor interference, high frequency module through combining the three dimensional high frequency inductor and passive component circuits. As shown in FIG. 5f, at first, a third metallic pattern 508 is formed on a second dielectric layer 507; then as shown in FIG. 5g, a third dielectric layer 509 is formed on the third metallic pattern 508 with coating; then as shown in FIGS. 5h~5i, after removing the third dielectric layer 509 in the defined region, and after that, filling and defining a fourth dielectric layer 510 and forming a fourth metallic pattern 511 interconnecting the upper and the lower metallic patterns; then as shown in FIGS. 5j~5k by forming a fifth metallic pattern 512 on the entire structure so as to form an upper metallic pattern layer of the high frequency inductor thereby electrically connecting with other circuital components; then forming a blank cavity 513 by removing the lower third dielectric layer 509; meanwhile, the high frequency inductor may be formed in the position apart from other passive components like resistor and capacitors as shown in FIGS. 5i~5o.

besides, it has become a tendency that more and more components of high frequency radio communication apparatus are constructed in differential and systematical ways to eliminate noises that the active components such as amplifier are disposed in pairs, and the coupled inductors are disposed in pairs accordingly resulting in exaggeratedly increasing the area occupied by inductor. The three dimensional S type high frequency inductor of the present invention provides an timely remedy for eliminating this disadvantage effectively.

Figure 6:
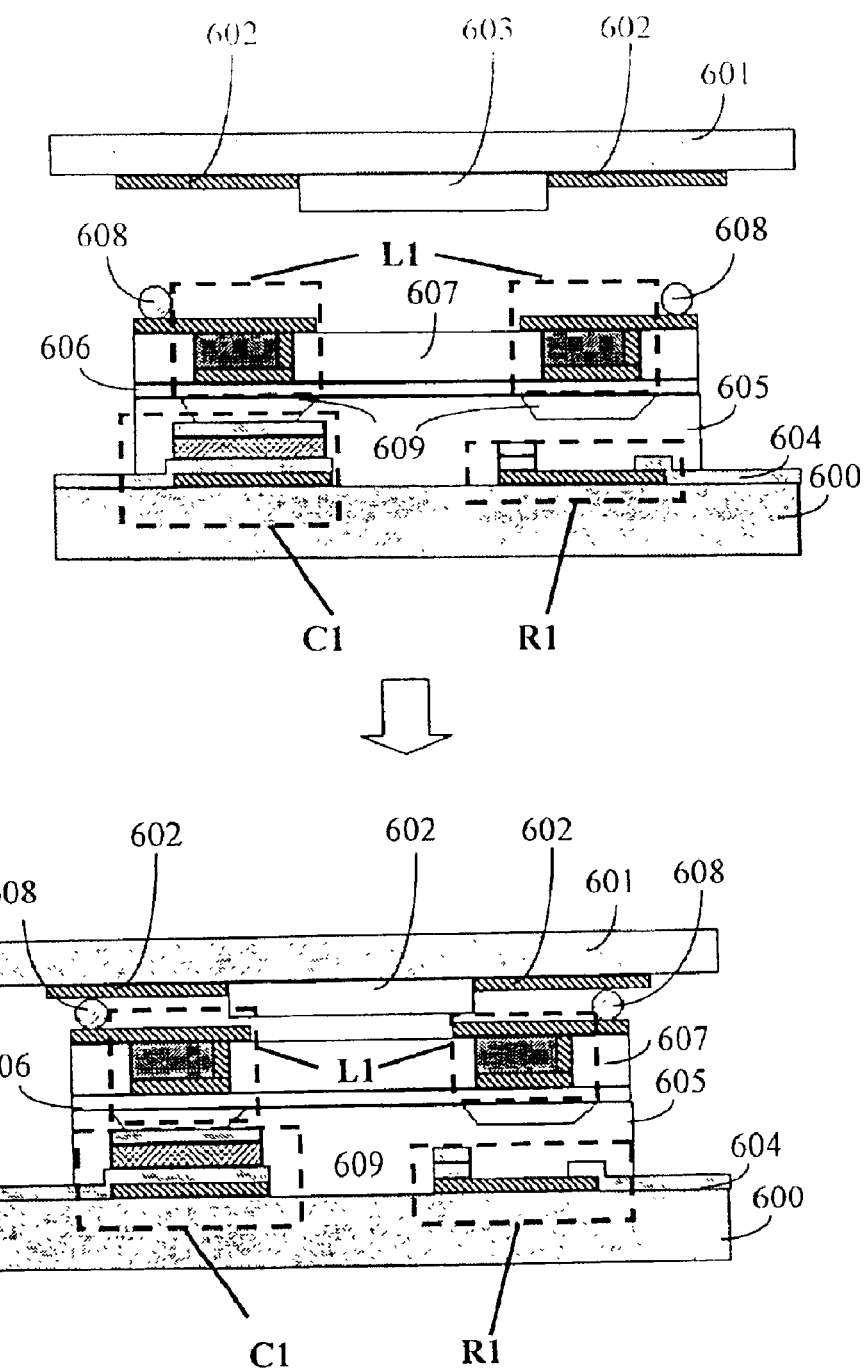
FIG. 6 is a cross sectional view of a module composed of combination of passive components, active components, and other basic frequency circuits and containing the toroidal-meander type high frequency inductor of a third embodiment of the present invention.

FIG. 6 shows the cross sectional view in a third embodiment of the present invention. As shown in FIG. 6a (left view), there are components C1, R1 and L1 mentioned in foregoing embodiment; a first and a second dielectric layer 605, 607 for isolating C1, R1 and L1; and a sustaining layer 606 for sustaining L1 on a blank cavity 609. By crystal stabilized or wafer level packaging, a high frequency module including C1, R1, and L1 can be completed through metal conductors 602 and joint nodes 608, where a circuit unit 603 on a substrate can be combined therein, the circuit unit 603 can be an active component or a power unit, or other base frequency circuit.

Although the present invention has been described with a certain degree of particularity by six examples, the present disclosure has been made by way of example and changes in details of structure may be made without departing from the spirit thereof.

What is claimed is:

1. A method for of fabricating a three dimensional adjustable high frequency inductor, comprising the steps of:
   providing a substrate;
   forming a first metallic pattern on said substrate;
   forming a first dielectric layer uniformly covering said first metallic pattern;
   removing part of said first dielectric layer in a defined region to form an empty hole, and filling said empty hole with a second dielectric layer;
   defining said second dielectric layer, and forming a second metallic pattern to interconnect said upper and said lower metallic patterns; and
   forming a third metallic pattern on the entire structure as the topmost metallic pattern of said high frequency inductor, and to make electrical communication with other circuital components.

2. The method as claimed in claim 1, wherein it further includes a step of forming a plurality of jointed pads for trimming the value of inductance according to actual requirement.

3. The method as claimed in claim 1, wherein said jointed pads are formed fixedly on said substrate or said dielectric layer for trimming value of inductance, and sustaining the entire inductor structure so as to stabilize the structure of said three dimensional high frequency inductor, wherein said jointed pads are arrayed at one side, or staggeringly disposed along two sides to sustain said structure more firmly.

4. The method as claimed in claim 1, wherein said structure of the three dimensional inductor is recessively mounted between the walls of said substrate and said dielectric layers so as to avoid inadvertent destruction from external forces.

5. The method as claimed in claim 1, wherein all of said jointed pads are disposed on a same plane for the convenience of trimming inductance value and electrical connection afterwards.

6. A method for of fabricating a three dimensional adjustable high frequency inductor, comprising the steps of:
   providing a substrate;
   forming a sustaining layer on said substrate;
   forming a first metallic pattern on said substrate;
   forming a first dielectric layer uniformly covering said first metallic pattern;
   removing part of said first dielectric layer in a defined region to form an empty hole, and filling said empty hole with a second dielectric layer;
   defining said second dielectric layer, and forming a second metallic pattern to interconnect said upper and said lower metallic patterns;
   forming a third metallic pattern on the entire structure as the topmost metallic pattern of said high frequency inductor, and to make electrical connection with other circuital components; and
   removing said substrate with an etchant to form a blank cavity.

7. The method as claimed in claim 6, wherein it further includes a step of forming a plurality of jointed pads for trimming the value of inductance according to actual requirement.

8. The method as claimed in claim 6, wherein said jointed pads are formed fixedly on said substrate or said dielectric layer for trimming value of inductance, and sustaining the entire inductor structure so as to stabilize the structure of said three dimensional high frequency inductor, therein said jointed pads are arrayed at one side, or staggeringly disposed along two sides to sustain said structure more firmly.

9. The method as claimed in claim 6, wherein said structure of three dimensional inductor is recessively mounted between the walls of said substrate and said dielectric layers so as to avoid inadvertent destruction from external force.

10. The method as claimed in claim 6, wherein all said jointed pads are disposed on a same plane for the convenience of trimming inductance value and electrical connection afterwards.

11. The method as claimed in claim 6, wherein the step of removing said substrate with an etchant to form said blank cavity is carried out with either etching from the front surface or form the rear surface to eliminate the substrate effect.

12. A method for of fabricating a three dimensional adjustable high frequency inductor, comprising the steps of:
   providing a substrate;
   depositing and defining a resistor layer on said substrate;
   depositing and by etching or lifting-off method to define two terminals of said resistor, and a first metallic pattern to serve as a lower electrode of a capacitor;
   depositing and defining a first dielectric layer and a second metallic pattern;
   forming a second dielectric layer for isolation on said resistor and said capacitor;
   forming a third metallic pattern on said second dielectric layer;
   forming a third dielectric layer uniformly covering said third metallic pattern;
   removing said third dielectric layer and filling with a fourth dielectric layer in a defined region;

defining said fourth dielectric layer and forming a fourth metallic pattern to interconnect the upper and the lower metallic patterns; and forming a fifth metallic pattern on the entire structure as the topmost metallic pattern of said high frequency inductor, and for electrical connection with other circuital components.

13. The method as claimed in claim 12, wherein said first dielectric layer interlarded between said first and said second metallic patterns, and said metallic patterns are formed into a capacitor.

14. The method as claimed in claim 12, wherein said second dielectric layer has a sufficient thickness to cover all components by uniformly coating on said substrate.

15. The method as claimed in claim 12, wherein said high frequency inductor is disposed at a side or upper position of other present passive components such as said resistor and said capacitor so as to form an effectively space saving and less interference micro high frequency module.

* * * * *